Jan. 13, 1970 P. R. THOMAS 3,489,953

STABILIZED INTEGRATED CIRCUT AND PROCESS FOR FABRICATING SAME

Filed Sept. 18, 1964

United States Patent Office 3,489,953
Patented Jan. 13, 1970

3,489,953
STABILIZED INTEGRATED CIRCUIT AND PROCESS FOR FABRICATING SAME

Philip R. Thomas, Dallas, Tex., assignor to Texas Instruments Incorporated, Dallas, Tex., a corporation of Delaware Filed Sept. 18, 1964, Ser. No. 397,490
Int. Cl. H01l 3/12
U.S. Cl. 317—101 5 Claims The present invention relates to integrated circuits and more particularly, but not by way of limitation, relates to an integrated high-gain amplifier circuit or the like which is stabilized against oscillation caused by electromagnetic feedback by a pair of closely-spaced ground planes, and further relates to a process for fabricating the integrated circuit.

Figure 1:
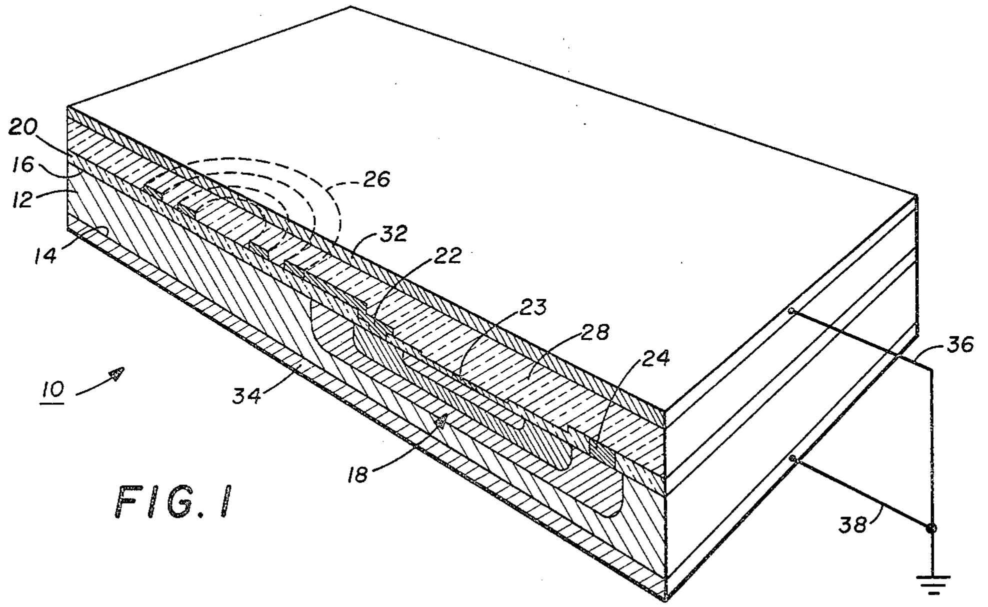

High-gain integrated circuit amplifiers operating at high frequencies, such as in the range from 200 mc. to the low gc., are subject to oscillation as a result of electromagnetically coupled feedback within the integrated circuit package. This problem is primarily due to the very close spacing between the active and passive components formed integral with the semiconductor substrate. The present invention is concerned with the construction of an integrated circuit such as, for example, the IF amplifier in an airborne radar system operating in the 0.5 gc. frequency range. In addition to being stabilized against oscillation due to feedback, such an integrated circuit must also be very compact and rugged, and must be mechanically and electrically stable over a wide temperature range.

In accordance with the present invention, an integrated circuit is comprised of a substrate having first and second generally parallel and opposite surfaces, one of which is formed by a semiconductor crystal and is separated from the other by a high resistivity layer. A circuit is formed integral with the substrate, either in or on the surface formed by the semiconductor. An insulation layer is then formed over the surface of the substrate and the circuit components and is integral with the substrate. A first metalized film is integral with the surface of the insulating layer, and a second metalized film is integral with the other surface of the substrate such that a pair of parallel ground planes are disposed on opposite sides of the components of the circuit. If desired, the first and second metalized films may be joined to completely envelop the integrated circuit device except for the openings necessary for coaxial transmission lines extending to the circuit.

In accordance with a more specific aspect of the invention, the substrate is high resistivity silicon and the insulation layer is glass chosen such that the coefficient of thermal expansion approximately matches that of the substrate.

In accordance with another aspect of the invention, the insulation is glass of a selected thickness such as to provide a dielectric constant approximating that of the substrate.

The present invention also contemplates a method for fabricating the integrated circuit device which comprises forming the circuit on a surface of a semiconductor substrate, depositing a relatively thick insulation layer over the components of the circuit and the exposed surface of the substrate, depositing a metalized film over the surface of the insulation, and depositing a metalized film over the other surface of the substrate.

In accordance with a more specific aspect of the invention, the insulating layer is glass and is deposited by applying a liquid in which very fine glass particles are suspended to the surface of the substrate, slowly evaporating the liquid to leave a residue of glass particles on the surface of the substrate, and firing the substrate to anneal the glass particles into an integral glass layer integral with the surface of the substrate.

Therefore an important object of the present invention is to provide an integrated circuit construction which is stabilized against electromagnetic cross talk between adjacent components by a pair of closely-spaced parallel ground planes disposed on opposite sides of the components of the circuit.

Another object of the invention is to provide an integrated circuit of the type described which is compact, rugged, and which may be economically manufactured.

Still another object of the invention is to provide an integrated circuit construction of the type described wherein the ground planes are disposed about the active and passive components of the circuit.

Yet another object of the invention is to provide a device of the type described wherein the dielectric characteristics equal the components and the respective ground planes are approximately equal.

A further object of the invention is to provide a process for fabricating an integrated circuit of the type described such that the substrate, the circuit components, the insulating layers and the ground planes are integral.

Figure 2:
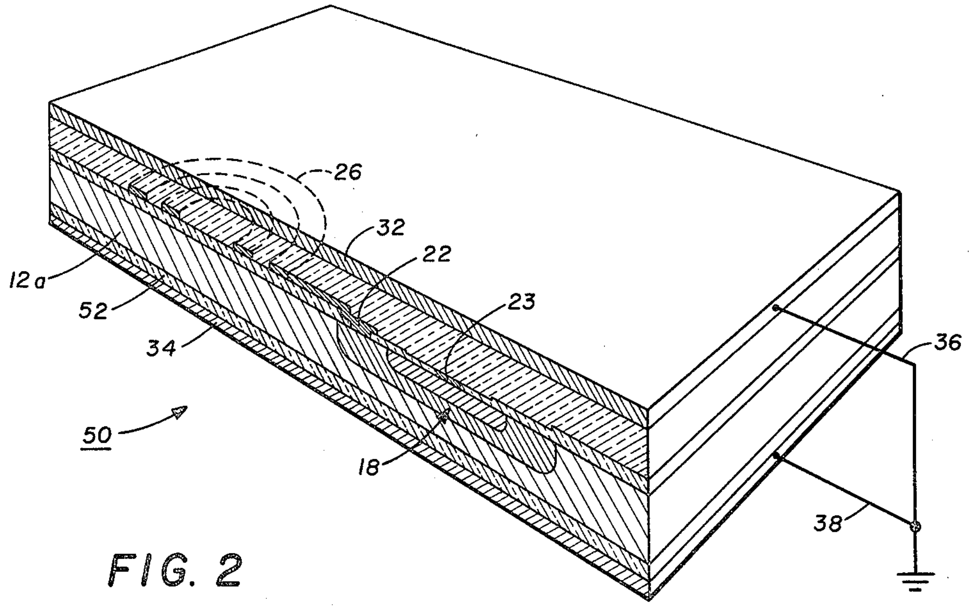

Additional objects and advantages of the invention will be evident to those skilled in the art from the following detailed description and drawings, wherein:

FIGURE 1 is a schematic perspective view, partially in section, of an integrated circuit constructed in accordance with the present invention; and, FIGURE 2 is a schematic perspective view similar to FIGURE 1 illustrating another embodiment of the invention.

Referring now to the drawings, and in particular to FIGURE 1, an integrated circuit device constructed in accordance with the present invention is indicated generally by the reference numeral 10. The circuit device 10 is comprised of a substrate 12 of single crystal, high resistivity silicon or other semi-insulating or high-resistance semiconductor material having first and second surfaces 14 and 16. The resistance required between the surfaces 14 and 16 will vary with the frequency at which the circuit is operated, the lower the frequency the greater the resistance required. However, for higher frequency applications, high resistivity semiconductor material is adequate. The components for a circuit, such as an IM amplifier for a radar system, are formed at the surface of the semiconductor substrate 12 using any conventional technique. For example, a transistor 18 may be formed in the surface by sequentially diffusing N-type, P-type and N-type regions into the surface 16 of the substrate through openings etched in an oxide film 20. Or the components may be formed on the surface of the substrate by epitaxial techniques. The circuit may also include interconnecting strip conductors such as 22, 23 and 24 which may be placed directly on the high resistivity substrate 12 or on the oxide film 20. The conductors may also form inductors such as indicated by the dotted outline at 26. In any event, for purposes of this disclosure and the appended claims, the components of the circuit may be considered as formed on the surface of the substrate 12.

An insulating layer 28 is deposited over and adherently bonded to the portion of the second surface of the substrate 12 which is exposed and to the components of the circuit and is therefore integral with the substrate. Metallized films 32 and 34 are adherently bonded to the insulating layers 28 and to the first side 14 of the substrate. When the metallized films 32 and 34 are connected to ground, as represented by the conductors 36 and 38, the entire integrated circuit is disposed between two closely-spaced ground planes. As a result of the closely-spaced ground planes, the electromagnetic radiation from any particular component is attenuated by a loss factor of $$\text{Loss}=k\left(\frac{x}{2s}\right)\text{db}$$

wherein $k$ is dependent upon the dielectric constant of the material between the components and the respective ground planes, $x$ is the distance from the point at which the electromagnetic wave is generated, and $s$ is the spacing between the ground planes. Although the attenuation increases as the spacing between the ground plane decreases, the insulating layer 28 should be at least 1.0 mil thick and is preferably from 3–5 mils in thickness. In many cases it will be desirable to envelop the entire circuit structure, including the substrate and insulating layer, in the metalized ground plane.

In accordance with an important aspect of the invention, the insulating layer 28 is glass. The glass should be selected so as to have a coefficient of thermal expansion closely matching that of the substrate so as to provide thermal-mechanical stability. Further, in cases where high-frequency transmission lines are to be stabilized, the insulating layer 28 is preferably about the same thickness as the substrate 12 so that the dielectric constant between the circuit components and each of the ground planes will be approximately equal. However, in accordance with the broader aspects of the invention, the insulating layer 28 may be any material which may be adherently bonded to the substrate 12, which is chemically compatible with the substrate and active components at various temperatures, and which has a thermal coefficient of expansion compatible with that of the substrate 12 so that the substrate will not be placed under stress due to temperature changes, and may be of any desired thickness, usually thin for amplifier application and relatively thick for transmission line application. The dielectric constant may be very closely matched by making the insulating layer 28 from high resistivity semiconductor material of the same type as the substrate 12. This can be accomplished by epitaxial growth, if a single crystal is desired for part of an active component, or by another process where a polycrystalline structure will suffice. The substrate 12 should be relatively thin, for amplifier applications where it is desired to place the ground planes as close to the active components as practical, and will usually be less than about ten mils in thickness.

Referring now to FIGURE 2, another integrated circuit device constructed in accordance with the present invention is indicated generally by the reference numeral 50. The integrated circuit device 50 is similar to the integrated circuit device 10 and corresponding parts are therefore designated by corresponding reference characters. However, the substrate **12*a* of the device 50 is doped semiconductor material rather than intrinsic silicon or semi-insulating semiconductor material. Therefore an insulating layer 52 is provided between the metallized film 34 and the substrate so that the ground plane formed by the film 34 will be electrically insulated from the components of the circuit. The insulating layer 52 may be any suitable material such as silicon dioxide, aluminum trioxide, glass, or the like, but is preferably glass. The device 50** is particularly suited for lower frequency applications where the dielectric constant should be higher.

The circuit devices 10 and 50 may be fabricated using the process of the present invention which will now be described. Assuming that the device 10 is to be constructed, the components of the circuit, which as mentioned, may be an IF amplifier or the like, are fabricated on and in the surface of the substrate 12 using any conventional technique as heretofore described. Then the glass insulating layer 28 is formed by applying a liquid in which a high concentration of very fine glass particles is suspended. The glass particles are allowed to settle from the liquid and deposit as a sediment on the surface of the substrate and over the components of the circuit. The sedimentation process tends to uniformly deposit the glass particles over the components of the circuit and produce an essentially planar surface. Then the substrate is heated to a temperature sufficiently high to fuse the glass particles into a solid mass which adherently bonds to the exposed portion of the substrate, the oxide insulating film 20, if any, or the components of the circuit, as the case may be.

Although it is preferred that the insulating layer 28 be glass applied by means of the liquid suspension technique heretofore described, the insulating layer 28 may also be formed from glass or quartz which is evaporated in a high vacuum and condensed on the surface of the substrate. The metalized films 32 and 34 may then be deposited by a conventional evaporation and condensation process.

Next the exposed surfaces of the substrate and insulating films are metalized, preferably by evaporating and condensing a metal onto the surfaces, or by some other well-known technique. Gold, aluminum or other suitable metal may be used for this purpose. However, if gold is to be deposited directly on a silicon substrate, a thin layer, a few hundred angstroms thick, of molybdenum or other metal which does not dope the silicon is preferably deposited on the surface 14 before the gold is deposited to prevent doping of the silicon by the gold.

From the above detailed description of preferred embodiments of the invention, it will be evident that a highly useful process for fabricating an integrated circuit device has been described. The device has an integrated circuit which is disposed between a pair of closely-spaced ground planes. The ground planes and the circuit are integrally interconnected so as to provide a rugged, sealed package. In cases where high-frequency transmission lines are involved, the dielectric properties between the circuit components and each of the ground planes may be made approximately equal for improved performance.

Although preferred embodiments of the invention have been described in detail, it is to be understood that various changes, substitutions and alterations can be made therein without departing from the spirit and scope of the invention as defined by the appended claims.

What is claimed is:

1. An integrated circuit device, comprising:
(a) a plurality of circuit components at one principal surface of a semi-insulating semiconductor substrate having two principal surfaces thereof;
(b) ohmic conductors interconnecting select ones of said plurality of circuit components;
(c) a pair of continuous metallized ground planes substantially parallel to said two principal surfaces and vertically spaced from said plurality of circuit components, one of said metallized ground planes being electrically isolated from said plurality of components by a continuous layer of dielectric material directly overlying said plurality of circuit components and said ohmic conductors, the other of said metallized ground planes being electrically isolated from said plurality of circuit components by said semi-insulating semiconductor substrate;
(d) said first and second metallized ground planes being ohmically connected to maintain said ground planes at substantially the same potential.

2. A semiconductor device, comprising:
(a) at least one active circuit component at one principal surface of a substrate having two principal surfaces, said substrate being comprised of a body of doped semiconductor material, said at least one active circuit component being comprised of at least two regions of opposite conductivity type semiconductor material with a PN junction therebetween;
(b) ohmic contacts to each of said at least two regions of opposite conductivity type semiconductor material;
(c) a first continuous layer of insulating material overlying said at least one active circuit component and said ohmic contact;
(d) a first deposited metallized film integral with and substantially covering the entire top surface of said continuous layer of insulating material;
(e) a second continuous layer of insulating material covering the other principal surface of said substrate;
(f) a second deposited metallized film integral with and substantially covering said second continuous layer of insulating material; and
(g) means for maintaining said first and second metallized films at substantially the same potential.

3. A semiconductor device comprising:
(a) at least one active circuit component at one principal surface of a semi-insulating semiconductor substrate having two principal surfaces thereof, said at least one active circuit component being comprised of at least two regions of opposite conductivity type semiconductor material with a PN junction therebetween;
(b) ohmic contacts to each of said at least two regions of opposite conductivity type semiconductor material;
(c) a continuous layer of glass overlying said at least one active circuit component and said ohmic contact;
(d) a first deposited metallized film integral with and substantially covering the entire top surface of said continuous layer of insulating material;
(e) a second deposited metallized film integral with and substantially covering the other of said principal surfaces of said substrate; and
(f) means for maintaining said first and second metallized films at substantially the same potential.

4. A semiconductor device comprising:
(a) at least one active circuit component at one principal surface of a substrate having two principal surfaces thereof, said at least one active circuit component being comprised of at least two regions of opposite conductivity type semiconductor material with a PN junction therebetween;
(b) ohmic contacts to each of said at least two regions of opposite conductivity type semiconductor material;
(c) a continuous layer of insulating material overlying said at least one active circuit component and said ohmic contacts, said layer of insulating material having substantially the same thickness as said substrate;
(d) a first deposited metallized film integral with and substantially covering the entire top surface of said continuous layer of insulating material;
(e) a second deposited metallized film integral with and substantially covering the other of said principal surfaces of said substrate; and
(f) means for maintaining said first and second metallized films at substantially the same potential.

5. An integrated circuit comprising:
(a) a semiconductor substrate;
(b) a plurality of interconnected semiconductor components adjacent one face of said substrate;
(c) an insulating layer covering substantially the entire opposite face of said substrate; and
(d) a metallic layer covering substantially the entire outer face of said insulating layer, said metallic layer being electrically isolated from said substrate by said insulating layer, and electrically connected as a ground plane in said circuit.

References Cited

UNITED STATES PATENTS

| | | | |
|---|---|---|---|
| 3,137,796 | 6/1964 | Luscher. | |
| 3,178,804 | 4/1965 | Ullery et al. ---- | 317—101 XR |
| 3,206,827 | 9/1965 | Kriegsman. | |

ROBERT S. MACON, Primary Examiner

J. R. SCOTT, Assistant Examiner

U.S. Cl. X.R.

29—577; 317—234, 235